United States Patent
Won et al.

(10) Patent No.: US 10,509,884 B2
(45) Date of Patent: *Dec. 17, 2019

(54) METHOD FOR ROUTING BETWEEN PINS OF SEMICONDUCTOR DEVICE AND DESIGN SYSTEM THEREWITH

(71) Applicant: Samsung Electronics Co., Ltd., Suwon-si, Gyeonggi-do (KR)

(72) Inventors: Hyosig Won, Suwon-si (KR); ChungHee Kim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,318

(22) Filed: Feb. 25, 2019

(65) Prior Publication Data

US 2019/0188354 A1   Jun. 20, 2019

Related U.S. Application Data

(63) Continuation of application No. 15/400,333, filed on Jan. 6, 2017, now Pat. No. 10,248,752.

(30) Foreign Application Priority Data

Jan. 11, 2016   (KR) .................. 10-2016-0003331

(51) Int. Cl.
  *G06F 17/50*   (2006.01)
(52) U.S. Cl.
  CPC ...... *G06F 17/5077* (2013.01); *G06F 17/5081* (2013.01)

(58) Field of Classification Search
  CPC .................. G06F 17/5077; G06F 17/5081
  USPC ........................... 716/126, 128–130
  See application file for complete search history.

(56) References Cited

U.S. PATENT DOCUMENTS

| | | | |
|---|---|---|---|
| 4,613,941 A * | 9/1986 | Smith ................. | G06F 17/5077 716/119 |
| 6,467,072 B1 | 10/2002 | Yang et al. | |
| 6,519,749 B1 * | 2/2003 | Chao .................... | G06F 17/5072 716/123 |
| 7,401,312 B2 | 7/2008 | Krauch et al. | |
| 7,793,249 B1 * | 9/2010 | Wadland ............. | G06F 17/5077 716/129 |
| 8,010,929 B2 | 8/2011 | Malhotra et al. | |
| 8,028,259 B2 | 9/2011 | Phan Vogel | |
| 8,359,554 B2 | 1/2013 | Wang et al. | |
| 8,484,594 B2 | 7/2013 | Kucar et al. | |
| 9,026,976 B2 | 5/2015 | Alpert et al. | |
| 9,064,081 B1 | 6/2015 | Hsu et al. | |
| 9,292,644 B2 | 3/2016 | Loh et al. | |

(Continued)

*Primary Examiner* — Stacy Whitmore
(74) *Attorney, Agent, or Firm* — Harness, Dickey & Pierce, P.L.C.

(57) ABSTRACT

Generating a routing between pins of a semiconductor device may include selecting one or more of candidate pins of the semiconductor device, generating a net list associated with the selected pins generating an interface script to execute the net list in a library-based disposition and wiring tool that is driven in a computer system, and executing the interface script through the library-based disposition. Pins may be selected from the candidate pins based on at least one of density, shapes, intervals, and sizes among the candidate pins. The net list may define a set of electrical connections between the selected pins.

20 Claims, 12 Drawing Sheets

(56) References Cited

U.S. PATENT DOCUMENTS

| | | |
|---|---|---|
| 10,248,752 B2* | 4/2019 | Won .................... G06F 17/5081 |
| 2002/0091979 A1 | 7/2002 | Cooke et al. |
| 2003/0222872 A1* | 12/2003 | Lin ....................... G06F 17/509 |
| | | 345/440 |
| 2005/0076319 A1 | 4/2005 | Chow et al. |
| 2007/0022400 A1 | 1/2007 | Kadota |
| 2007/0061770 A1 | 3/2007 | Kobayashi |
| 2009/0070726 A1 | 3/2009 | Mehrotra et al. |
| 2010/0100862 A1 | 4/2010 | Ohtsuka |
| 2012/0221994 A1 | 8/2012 | Vats et al. |
| 2013/0086544 A1* | 4/2013 | Alpert ................. G06F 17/5077 |
| | | 716/129 |
| 2015/0113490 A1 | 4/2015 | Saha et al. |
| 2016/0034628 A1 | 2/2016 | Rajendran et al. |
| 2016/0086863 A1 | 3/2016 | Won et al. |
| 2018/0307790 A1* | 10/2018 | Chuang ............... G06F 17/5077 |
| 2019/0065647 A1* | 2/2019 | Chen ................... G06F 17/5036 |

\* cited by examiner

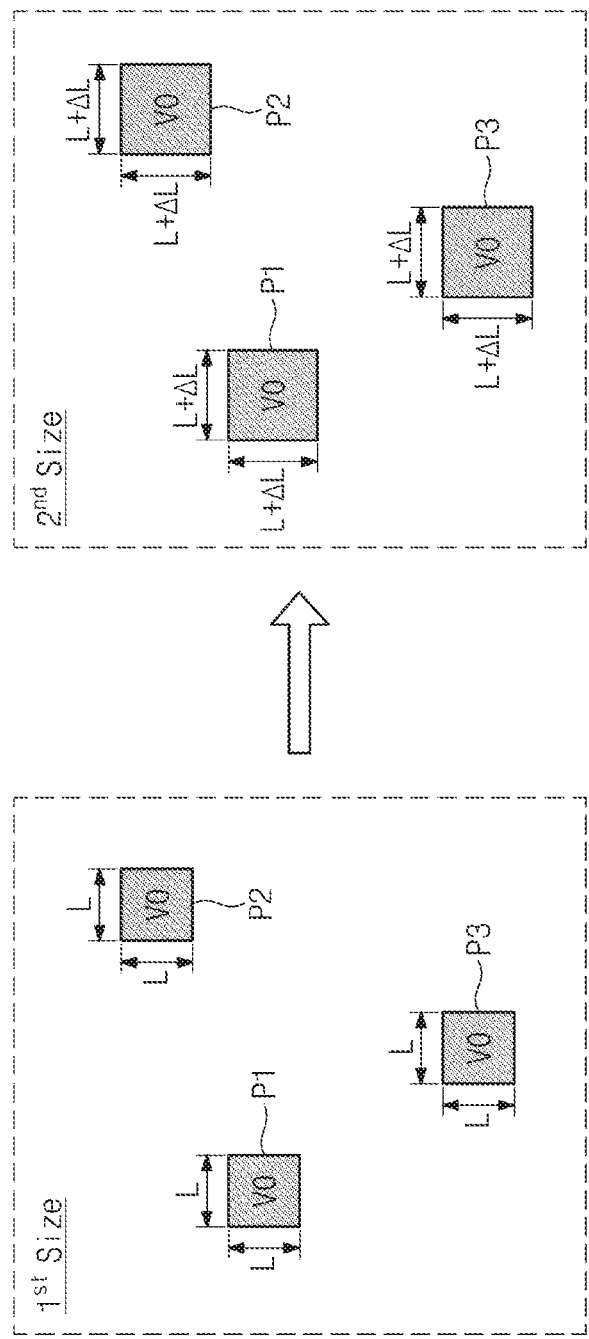

FIG. 8

| Net | | Pin Number | | | | |
|---|---|---|---|---|---|---|
| | | P_S1 | P_E1 | P_S2 | P_E2 | P_E3 |
| 2-PiN | Net_21 | P1 | P2 | – | – | |
| | ⋮ | ⋮ | ⋮ | ⋮ | ⋮ | ⋮ |
| | Net_2i | P21 | P22 | – | – | – |
| 3-PiN | Net_31 | P31 | P33 | – | P34 | – |
| | Net_33 | P35 | P36 | P37 | – | – |
| | ⋮ | ⋮ | ⋮ | ⋮ | ⋮ | ⋮ |
| | Net_3j | P41 | P42 | – | P44 | – |
| 4-PiN | Net_41 | P101 | P102 | – | P103 | P104 |
| | Net_43 | P141 | P142 | – | P143 | P144 |
| | ⋮ | ⋮ | ⋮ | ⋮ | ⋮ | ⋮ |
| | Net_4k | P155 | P156 | P155 | P157 | P158 |
| ⋮ | ⋮ | ⋮ | ⋮ | ⋮ | ⋮ | ⋮ |

METHOD FOR ROUTING BETWEEN PINS OF SEMICONDUCTOR DEVICE AND DESIGN SYSTEM THEREWITH

CROSS-REFERENCE TO RELATED APPLICATIONS

This application is a continuation of U.S. application Ser. No. 15/400,333, filed on Jan. 6, 2017, which claims priority under 35 U.S.C. § 119 to Korean Patent Application No. 10-2016-0003331 filed Jan. 11, 2016, in the Korean Intellectual Property Office, the entire contents of each of which are hereby incorporated by reference.

BACKGROUND

Example embodiments of the inventive concepts described herein relate to semiconductor devices, and more particularly, relate to generating routings and wiring structures between pins of semiconductor devices.

Mobile apparatuses, such as smartphones, tablet PCs, digital cameras, MP3 players, Personal Digital Assistants (PDAs), and so on, are increasingly used in recent years. In the mobile apparatuses, high-speed processors are widely used due to an increase in multimedia drive and data throughput. Various kinds of application programs are driven in mobile apparatuses. For the purpose of driving various application programs, a mobile apparatus usually employs semiconductor devices, for example, a working memory (e.g., DRAM), a nonvolatile memory, and an application processor (hereafter referred to as 'AP'). In the case of applying a new process for producing a semiconductor device, a method for preliminarily monitoring devices, such as transistors of the semiconductor device, is used for raising yields. For monitoring such devices, a testing semiconductor device is formed to measure characteristics of a semiconductor device through a probing operation. For example, three or more probing pads may be formed, in measuring DC characteristics of a transistor, and the pads may be respectively wired with terminals of the transistor. A library of cells or functional blocks could be generated for a wiring design with general mass-producing chips, and the wiring design could be automatically completed based on the library through a routing tool. However, it may be difficult to use a library-based routing mode at a stage of providing pin locations before a cell library is generated as like a testing semiconductor device.

SUMMARY

Some example embodiments of the inventive concepts provide pin selection and routing methods for selecting an increased quantity of test target devices in a given area on a semiconductor device. Additionally, some example embodiments provide automation of determining routings between pins on a semiconductor device by allowing a general routing tool to be used without a library.

In accordance with some example embodiments, a method for designing a routing between pins of a semiconductor device may include: receiving information associated with candidate pins in the semiconductor device; pre-processing the candidate pins to select one or more of the candidate pins as selected pins, based on at least one of a density of the candidate pins, one or more shapes of the candidate pins, one or more intervals between one or more sets of the candidate pins, and one or more sizes of the candidate pins; generating a net list associated with the selected pins, the net list defining a set of electrical connections between the selected pins; and generating an interface script to execute the net list in a library-based disposition and wiring tool that is driven in a computer system; and executing the interface script through the library-based disposition and wiring tool to generate one or more routings between the selected pins of the semiconductor device, the one or more routings configured to establish the set of electrical connections between the selected pins.

In accordance with some example embodiments, a method for designing a testing semiconductor device in a semiconductor design system driving a library-based routing tool may include: generating a plurality of pins corresponding to terminal locations of device elements of the semiconductor device; selecting one or more pins from the generated pins as selected pins, based on a determination that a density associated with the selected pins is less than or equal to a density threshold; generating one or more adjusted pins based on adjusting one of a location of one or more selected pins, a shape of one or more selected pins, a size of one or more selected pins, and an interval between one or more sets of selected pins; generating a net list based on receiving information defining electrical connections between the adjusted pins; generating an interface script that is executable by a routing tool, based on the net list; and generating a wiring structure that includes the electrical connections between the selected pins, based on executing the interface script through the routing tool.

In accordance with some example embodiments, a computer-based design system configured to drive a disposition and wiring tool, and further configured to perform a design of a semiconductor device, may include: a communication interface configured to receive geometrical or positional information associated with candidate pins of the semiconductor device, the candidate pins corresponding to terminal locations of device elements of the semiconductor device; a memory storing computer readable instructions; and a processor. The processor may be configured to execute the computer readable instructions to receive information associated with candidate pins in a semiconductor device; select one or more of the candidate pins as selected pins, based on at least one of a density of the candidate pins, one or more shapes of the candidate pins, one or more intervals between one or more sets of the candidate pins, and one or more sizes of the candidate pins; generate a net list associated with the selected pins, the net list defining a set of electrical connections between the selected pins; generate an interface script to execute the net list in a library-based disposition and wiring tool; and execute the interface script through the library-based disposition and wiring tool to generate one or more routings between the selected pins of the semiconductor device, the one or more routings configured to establish the set of electrical connections between the selected pins.

In accordance with some example embodiments, a method may include: selecting one or more pins of a plurality candidate pins in a semiconductor device as selected pins based on at least one of density, shapes, intervals, and sizes associated with the candidate pins; generating a net list associated with the selected pins, the net list defining a set of electrical connections between the selected pins; and driving a disposition and wiring tool to generate a wiring structure that includes the electrical connections between the selected pins of the semiconductor device, based on the net list.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 6A-C schematically illustrate a method for adjusting sizes or shapes of pins during a pre-processing loop for routing;

FIG. 8 is a table showing a net list of pins according to some example embodiments of the inventive concepts.

DETAILED DESCRIPTION

Figure 1:
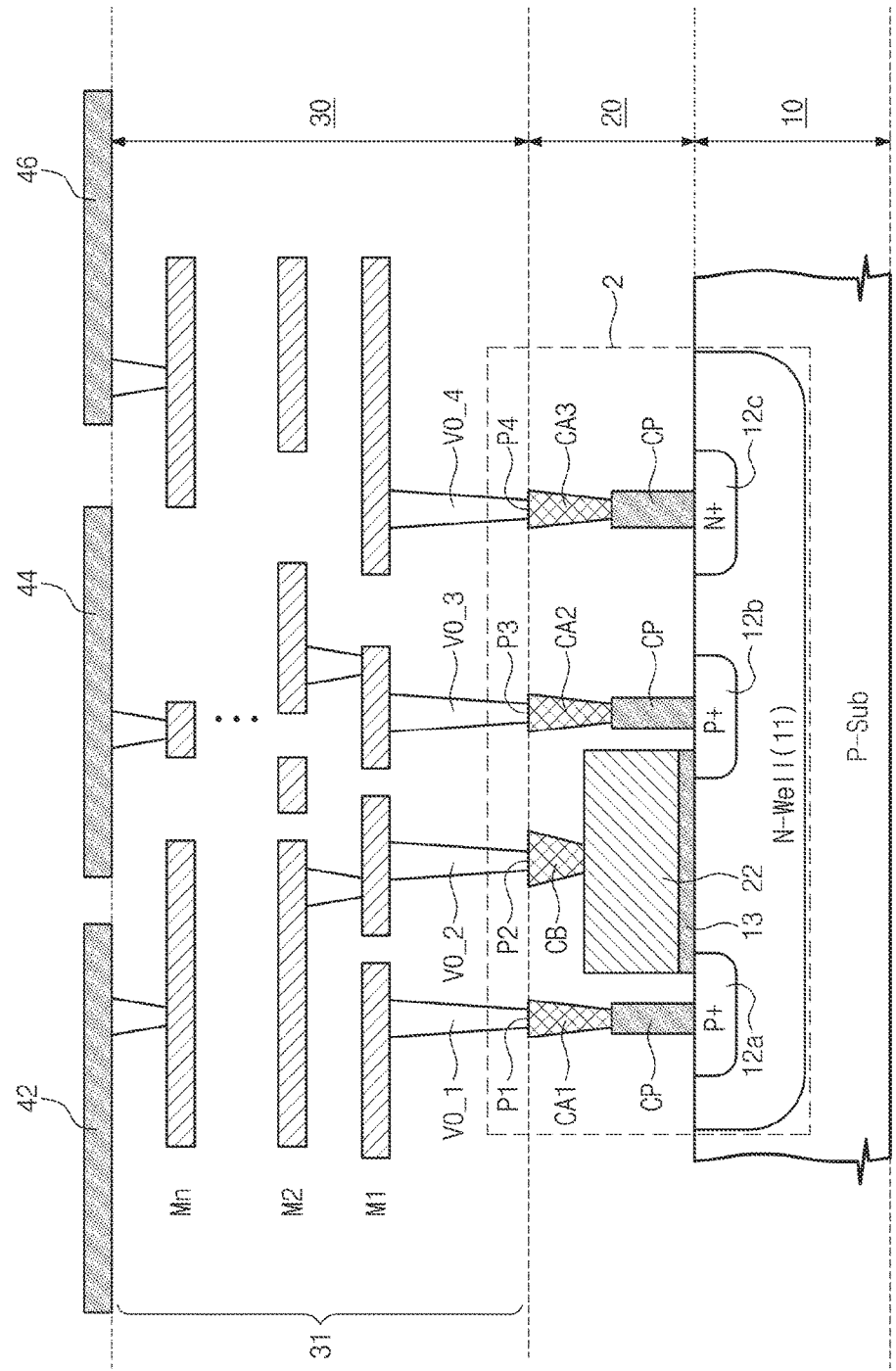
FIG. 1 is a sectional view illustrating a semiconductor device which is designed according to some example embodiments of the inventive concepts.

Hereafter, example embodiments of the inventive concepts will be described in conjunction with the accompanying drawings. Various example embodiments described herein, however, may not be intentionally confined in specific embodiments, but should be construed as including diverse modifications, equivalents, and/or alternatives. With respect to the descriptions of the drawings, like reference numerals refer to like elements.

FIG. 1 is a sectional view illustrating a semiconductor device which is designed according to some example embodiments of the inventive concepts. Referring to FIG. 1, a semiconductor device 1 may include device layers 10 and 20 fabricated in a device formation process (i.e., Front-Of-End-Line; FEOL), and a wiring layer 30 fabricated in a wiring process (i.e., Back-End-Of-Line; BEOL). The semiconductor device 1 may be fabricated for testing to monitor characteristics of device elements, such that the semiconductor device 1 is configured to monitor one or more characteristics of one or more device elements. The semiconductor device 1 may be sectioned into a substrate layer 10, a device layer 20, and a wiring layer 30. Pads 42, 44, and 46 for probing may be finally formed on the wiring layer 30.

The FEOL process may include fabricating basic device elements which operate in the semiconductor device 1. For example, in the FEOL process, dopants may be injected into a substrate to form a well, a source, and a drain. Additionally, the BEOL process may form an insulation layer, a gate, and so on. The FEOL process generally forms device elements such as transistors which are basic components of a semiconductor device.

In some example embodiments, a PMOS transistor 2 comprising the semiconductor device 1 may be formed in an N-well 11 which is formed on a P-type substrate (P-sub) through the FEOL process. In the N-well 11, P+ doped regions 12a and 12b may be formed for one end (drain or source) of the PMOS transistor 2 and an N+ doped region 12c may be formed for body bias. An insulation film 13 may be formed on a channel. On the insulation film 13, a gate electrode 22 may be formed as a conductive type. On the gate electrode 22, a contact CB may be formed for connection with a metal line or via. Contact plugs CP may be formed on the doped regions 12a, 12b, and 12c. On the contact plugs CP, contacts CA1, CA2, and CA3 may be formed for connection with a metal line or via. As also, it can be understood that a metal line and via may be further formed through the FEOL process. The wiring layer 30 that includes the metal lines and vias therein may be referred to herein as including a wiring structure.

After device elements are formed through the FEOL process for fabricating device elements of the semiconductor device, the BEOL process may be performed as a wiring process for generating electrical connections between the device elements. For example, in the BEOL process, various logic circuits ("logic cells") may be formed based on electrical connections between one or more combinations of terminals such as a gate, drain, source, some combination thereof, or the like of the PMOS transistor 2. For example, standard logic cells may be formed with a part of metals for a plurality of transistors through the BEOL process. A wiring design may be automatically performed by a routing tool in units of the standard cells or functional blocks (IP).

Generation of an automatic wiring design ("wiring structure") by a routing tool may be performed based on a cell library after generation of a cell library. A cell library may include information indicating particular wiring structures that establish particular electrical connections between particular sets of pins of a semiconductor device, where the particular wiring structures are associated with particular corresponding logic circuits. As a result, the particular wiring structures may implement (also referred to herein as "establish" and/or "generate") the particular corresponding logic circuits. In a general chip design process, wiring structures, including a structure of one or more instances of wiring that establish electrical connections between device elements of the semiconductor device, may be automatically designed in a cell library. If various types of logic cells are selected from a library, a routing rule may automatically generate an optimized wiring design that establishes electrical connections between device elements of the semiconductor device to establish the various types of logic cells. For a testing chip, the rest may be performed in the unit of transistor and/or in the unit of cell. For fabricating a testing chip at the early stage of design, a routing between various points in a semiconductor device may be generated to enable a probing operation in a transistor unit of the semiconductor device. A routing may be generated to enable electrical connections to be established to electrically connect specific points (hereafter, referred to as 'pins') of the semiconductor device. In some example embodiments of the inventive concepts, a method for fabricating an optimized testing chip may be provided with pins' positional information which is not supported from a library. Positional information of a pin may include information indicating a position, location, etc. of a pin in a semiconductor device.

In some example embodiments, a specific point of a transistor will be referred to as a pin. A pin may refer to a terminal location of a transistor of the semiconductor device. That is, locations P1, P2, P3, and P4 of the contacts CA1, CA2, CA3, and CB, for connection with a metal line or via, may correspond to pin locations in the semiconductor device 1. In some example embodiments, one or more elements connecting the contacts CA1, CA2, CA3, and CB with a conductive line may be referred to as pins. In some example embodiments of the inventive concepts, the locations P1, P2, P3, and P4 formed at interfaces between the contacts CA1, CA2, CA3, and CA4 and the bottom of the wiring layer 30 may be referred to as pins.

To test electrical characteristics of the PMOS transistor 2, at least the pins P1, P2, and P3 may be connected with the probing pads 42, 44, and 46. In a routing method according to some example embodiments of the inventive concepts, if locations of the pins P1, P2, and P3 are determined, the pins may be selected based on one or more of density, locations, and sizes of the pins. Then it may be determined whether selected pins are associated with violations of one or more thresholds. Such thresholds may be referred to herein as "rules," and violations of such thresholds may include exceeding the thresholds.

After determining pin locations of transistors and a location of a pin connected with pads, a commercial routing tool may be employed to perform a routing. That is, the routing may be performed through a commercial tool by making a net list with pins of transistors in the form of standard library. Generating a routing may include etching, carving, drilling, forming, etc. through one or more materials 31 of a semiconductor device, such that the routing includes one or more channels extending through at least a portion of the one or more materials 31. The one or more channels may connect pins in the semiconductor device. A wiring structure may be formed based on providing one or more wiring structure materials in the one or more channels. Forming ("generating") the wiring structure may include generating one or more vias, metal lines, some combination thereof, or the like based on providing the one or more wiring structure materials in the one or more channels.

After completing a routing between pins, a mask may be provided to form vias V0_1, V0_2, V0_3, and V0_4 and metal lines M1, M2, . . . , and Mn. Then, a testing semiconductor device may be completed by finally forming the vias V0_1, V0_2, V0_3, and V0_4 and metal lines M1, M2, . . . , and Mn according to the routings to generate a wiring structure that establishes electrical connections between certain pins to establish certain corresponding logic cells.

In some example embodiments, the above pin-unit routing may be complicated by an absence of a library in the unit of standard cell, and the testing semiconductor device 1 which is designed through such a procedure. With the testing semiconductor device 1 according to some example embodiments of the inventive concepts, a routing design between pins may be automatically performed through a library-based commercial routing tool in the circumstance of providing only information of the pins. According to some example embodiments, one or more specific pins may be excluded from a set of candidate pins between which routings may be generated. Such exclusion may result in improving the routing efficiency of routings between pins. In some example embodiments, routing efficiency of a generated routing may be improved based on adjustments to one or more of sizes, shapes, densities, and intervals of pins.

Figure 2:
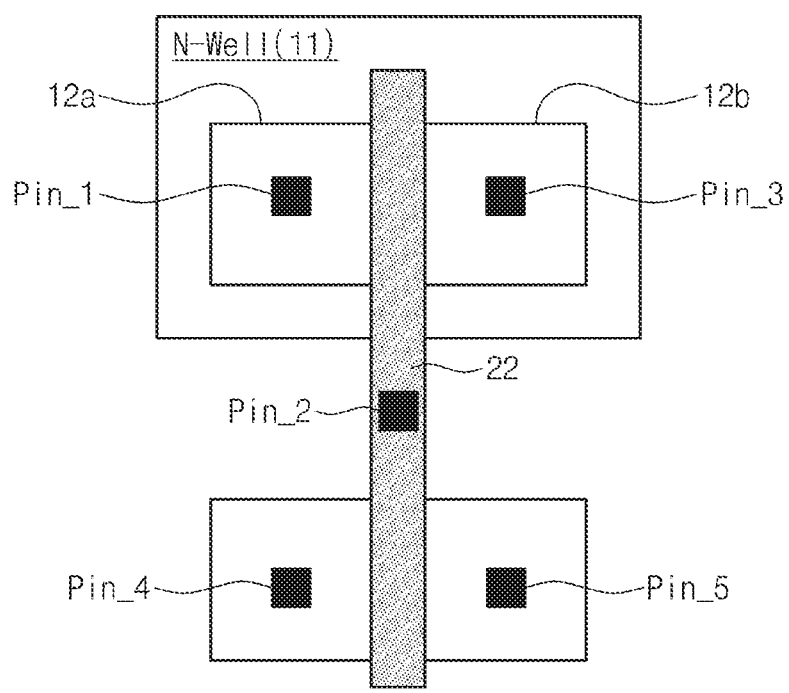
FIG. 2 is a plan view illustrating a PMOS transistor of FIG. 1.

FIG. 2 is a plan view illustrating a PMOS transistor of FIG. 1. Referring to FIG. 2, a PMOS transistor is formed in the N-well 11 and an NMOS transistor is formed on the P-type substrate.

Pins may correspond to locations of the contacts CA1 and CA2 which are formed over the doped regions 12a and 12b which act respectively as a drain and a source in the PMOS transistor 2. For example, a pin Pin_1 may correspond to one end of the PMOS transistor 2 which is placed over the doped region 12a. A pin Pin_2 may correspond to the other end of the PMOS transistor which is placed over the doped region 12b. A pin Pin_3 may be formed through the contact CB which is formed on the gate electrode 22.

Additionally, a pin Pin_4 may be formed through a contact at an end of the NMOS transistor and a pin Pin_5 may be formed through a contact at the other end of the NMOS transistor. The gate electrode 22 may be used even for a gate electrode of the NMOS transistor. Therefore, the pins may correspond to cross points of the wiring layer 30 (see FIG. 1) and the device layer 20 (see FIG. 1) such as transistor. The pins may be formed through vias or contacts.

Figure 3:
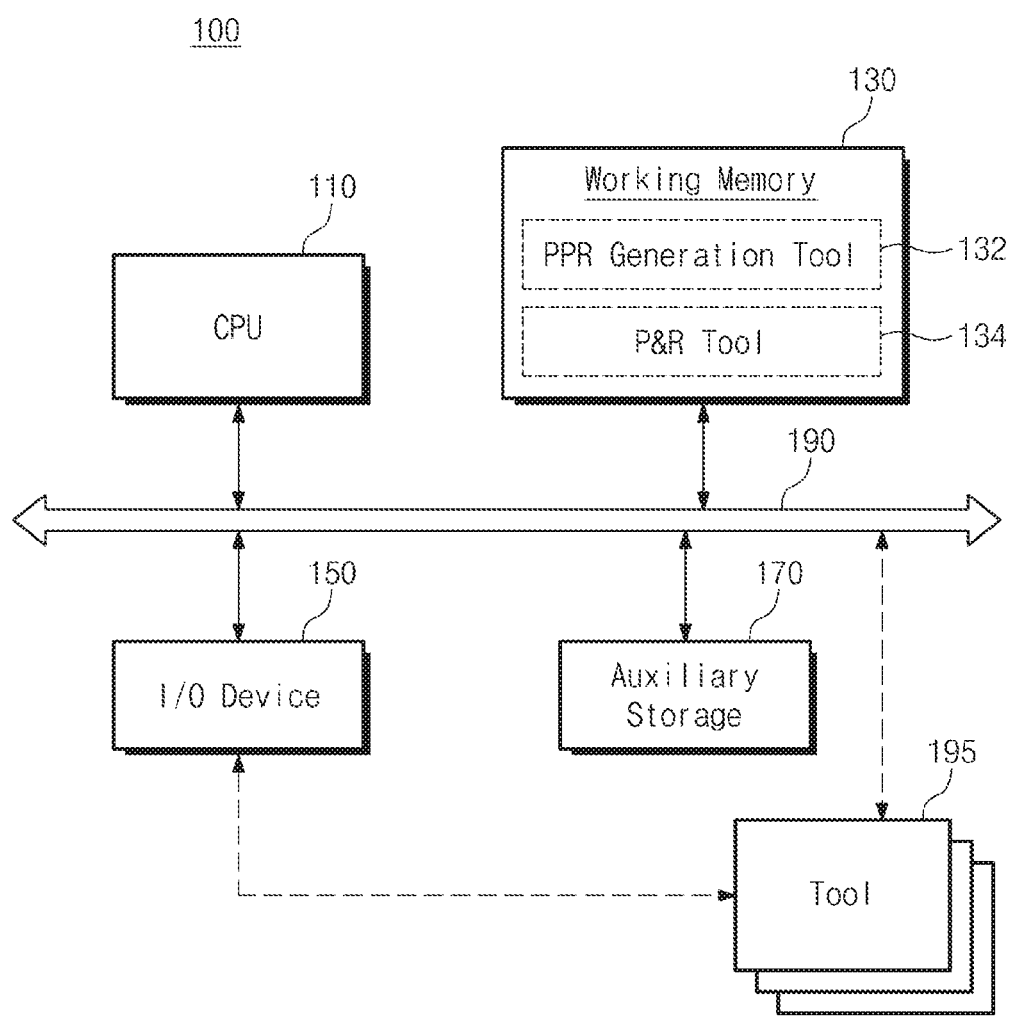
FIG. 3 is a block diagram illustrating a semiconductor design system 100 according to some example embodiments of the inventive concepts.

FIG. 3 is a block diagram illustrating a semiconductor design system 100 according to some example embodiments of the inventive concepts. Referring to FIG. 3, the semiconductor design system 100 may include a CPU 110 (also referred to herein as a "processor"), a working memory 130 (also referred to herein as a "memory"), an input/output unit 150 (also referred to herein as a "communication interface"), an auxiliary storage unit 170, and a system bus 190. The semiconductor design system 100 may load a program for performing a routing between pins of the semiconductor device according to some example embodiments of the inventive concepts. Such a program may be referred to as computer-readable instructions. In some example embodiments, the semiconductor design system 100 may be a computer system for driving various types of simulation tools or design tools.

The CPU 110 may execute software (application program, operating system, device driver, computer readable instructions, some combination thereof, or the like) which is to be performed in the semiconductor design system 100. The CPU 110 may execute various types of application programs or design and verification tools based in an operating system (OS). For example, the CPU 110 may drive an inter-pin routing generation tool 132 which is loaded into the working memory 130. Additionally, the CPU 110 may drive a disposition and wiring tool 134 which performs a routing design based on a library loaded into the working memory 130. In some example embodiments, the CPU 110 may drive one or more tools 195 to generate a routing between pins in a semiconductor device, generate a wiring structure in the semiconductor device based on the generated routing, some combination thereof, or the like. As shown in FIG. 3, the one or more tools 195 may be connected to bus 190. In some example embodiments, the one or more tools 195 may be connected to I/O device 150.

An operating system (OS) or application program may be loaded into the working memory 130. An OS image (not shown), which is stored in the auxiliary storage unit 170 when booting the semiconductor design system 100, may be loaded into the working memory 130 based on a booting sequence. An operating system (OS) may allow general input/output operations to be assisted in the semiconductor design system 100. As also, for selection by a user or for providing a basic service, application programs may be loaded into the working memory 130. Especially, the inter-pin routing generation tool (PPR generation tool) 132 and the disposition and wiring tool (P&R tool) 134 may be loaded into the working memory 130 from the auxiliary storage unit 170. Although not shown, the working memory 130 may further include a tool for designing and verifying a schematic circuit, or layout design tools for generating a schematic circuit into a layout.

Based on information associated with general pins which are formable in the semiconductor device, the inter-pin routing generation tool 132 may perform selection of pins based on a density of pins. In some example embodiments, at least one of shapes, locations, and sizes of selected pins, and intervals between pins, may be adjusted. In some example embodiments, one or more of shapes, locations, and sizes of pins, and a procedure of selection in consideration of density of the pins, may be implemented in an iterative loop. Pins selected through such a pin selection and adjustment procedure performed by the inter-pin routing generation tool 132 may be included in a net list generated by the inter-pin routing generation tool 132. The generated net list may be generated as an interface script which can be processed by the disposition and wiring tool 134 which performs a library-based routing. The disposition and wiring tool 134 may automatically generate a routing between pins. In some example embodiments, the CPU 110 executes the tool 134 to drive the one or more tools 195 to generate the routing.

The input/output unit 150 may control user inputs and outputs from user interface units. For example, the input/output unit 150 may be equipped with an input unit such as keyboard, mouse, or touch pad, and an output unit such as monitor, and may receive geometrical information, such as pin locations, and information about a design rule for routing. Additionally, in some embodiments, even information defining relation of connection between pins, which are to be connected each other, may be received through the input/output unit 150. And the input/output unit 150 may display an inter-pin routing result which is generated by the semiconductor design system 100.

The auxiliary storage unit 170 may be provided as a storage medium of the semiconductor design system 100. The auxiliary storage unit 170 may store an application program, an OS image, and diverse data. The auxiliary storage unit 170 may be even provided with a memory card (MMC, SD, MicroSD, and so on), or a hard disk drive (HDD). The auxiliary storage unit 170 may include a NAND-type flash memory having a large storage capacity. In some example embodiments, the auxiliary storage unit 170 may even include a NOR flash memory or a next-generation nonvolatile memory such as PRAM, MRAM, ReRAM, or FRAM.

The system bus 190 may be used as an interconnector for providing an internal network of the semiconductor design system 100. The CPU 110, the working memory 130, the input/output unit 150, and the auxiliary storage unit 170 may be electrically connected through the system bus 190 and may exchange data therewith. A configuration of the system bus 190 may not be restrictive to the aforementioned and rather may further include intermediate means for efficient management.

According to the described above, the semiconductor design system 100 may perform a routing design for selecting testable device elements as many as possible only with pin locations and geometrical information before generating a library. The semiconductor design system 100 may select optimized routable pins with reference only to pin locations and geometrical information. The semiconductor design system 100 may even adjust shapes, locations, and sizes of pins, and intervals between the pins for selecting optimized pins. After setting connection information for pins selected by such an optimized condition, it may be permissible to make an interface script which is executed by the disposition and wiring tool 134 performing a wiring design based on a library. If the disposition and wiring tool 134 is executed, a routing design between pins may be performed automatically.

Figure 4:
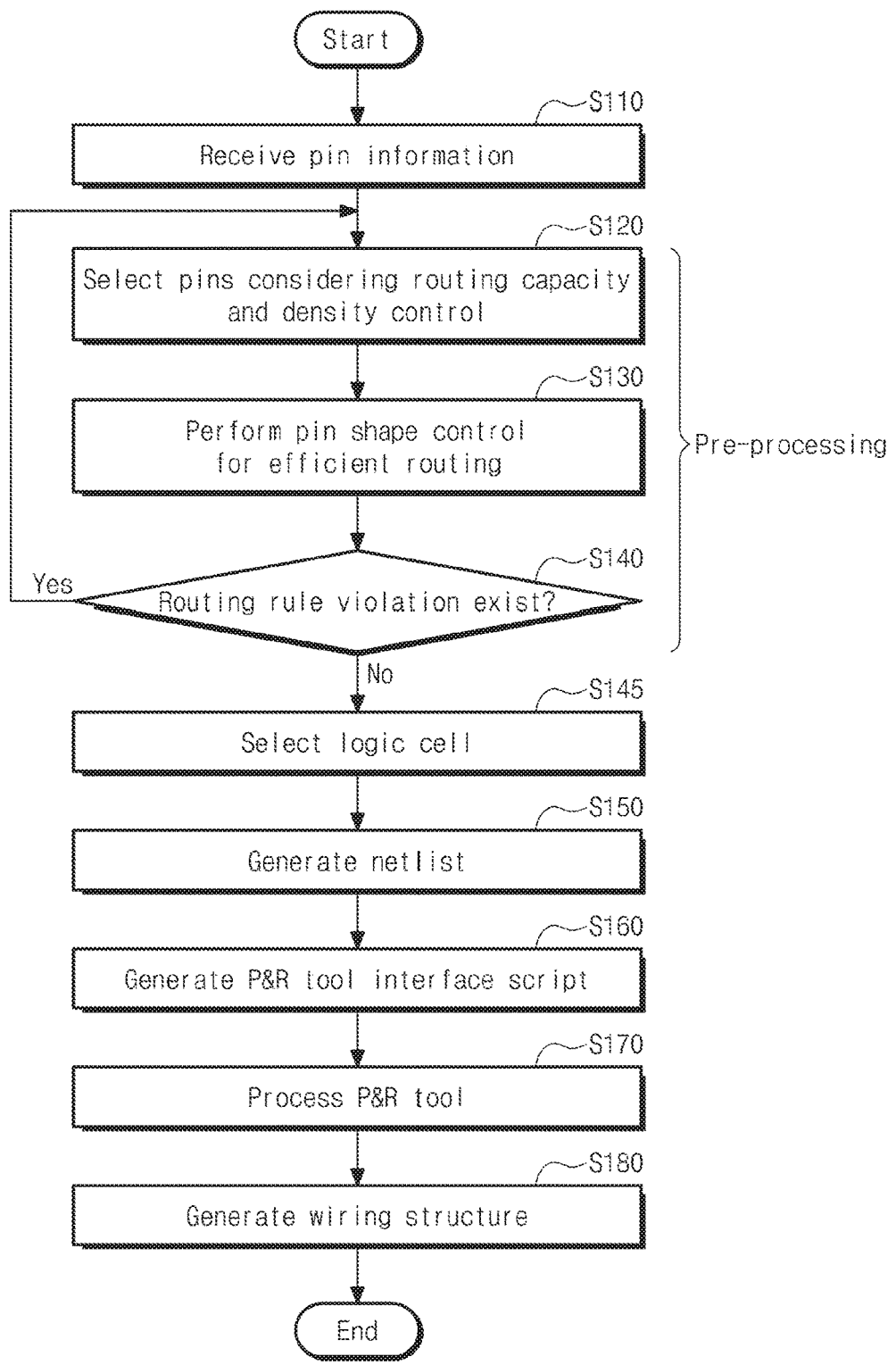
FIG. 4 is a flow chart showing a method for automatically performing a routing between pins according to some example embodiments of the inventive concepts.

FIG. 4 is a flow chart showing a method for automatically performing a routing between pins according to some example embodiments of the inventive concepts. Referring to FIG. 4, positional information of all pins of a target area, from which an inter-pin routing is generated, may be provided to the semiconductor design system 100 according to some example embodiments of the inventive concepts. Then, connectable pins may be selected and adjusted in shape by the inter-pin routing generation tool 132. If connection relation between pins is selected to generate an interface script, a routing for the selected pins may be automatically generated by the disposition and wiring tool 134. This will be more described below.

In step S110, the semiconductor design system 100 may receive positional and geometrical information associated with pins in an area of a semiconductor device where a routing is performed. For example, a user may input pin locations and geometrical information associated with pins P1, P2, P3, . . . P4 of semiconductor device 1 through the input/output unit 150. Positional and geometrical information associated with pins of an area of a semiconductor device may be provided as preliminarily generated information to the semiconductor design system 100. An area of a semiconductor device as a routing target may be a "semiconductor area" selected for testing. For example, a semiconductor area may correspond to an Intellectual Property (IP) unit, a macro unit, or the whole area ("entirety") of a chip.

In step S120, the semiconductor design system 100 may check density of the pins of the semiconductor device, herein referred to as "candidate pins" and/or "general pins," to select as many pins from the candidate pins as possible. Based on the input positional and geometrical information associated with general pins (herein, "candidate pins") of the semiconductor device, the semiconductor design system 100 may preclude selection of excessive quantities of pins in a given area of the semiconductor device. If a quantity of selected pins is equal to or greater than a specific quantity threshold, the wiring layer 30 (see FIG. 1) may excessively consume a metallic resource for connecting the pins. And it may be difficult to perform a routing under a proposed design rule in an area where the density of the selected pins is equal to or greater than a threshold density. Accordingly, a density of the selected pins may be adjusted to increase and/or maximize the quantity of selected pins in a routable range.

Various methods may be performed to adjust a density of pins. For example, if pins are detected with a number ("quantity") equal to or larger than a reference threshold number while sliding a window of a standard size in a pins' area, adjustment density of pins in the area may be adjusted. For example, a Local Window (hereafter referred to as 'LW') exposing a local area of the semiconductor device may be used to select pins. Although an LW may be used for adjusting density, it may not be easy to perform a routing even in the case that pins are crowded in a part of an area of a semiconductor device. Accordingly, a Global Window (GW), which exposes a relatively wide area of the semiconductor device, may be used to multiply check density of pins. This multiple density checking with a GW may increase and/or maximize the number of routable pins in a target semiconductor area.

In step S130, the semiconductor design system 100 may adjust one or more of shapes, sizes, and directions of one or more selected pins, and intervals of at least some of the pins, some combination thereof, or the like. For example, the semiconductor design system 100 may adjust sizes of selected pins into optimized sizes to enable the generation of an efficient wiring structure between the selected pins. In some example embodiments, the semiconductor design system 100 may adjust shapes of selected pins based on patterns and directions of wires and shapes of vias in a wiring structure generated according to a routing. The semiconductor design system 100 may adjust shapes of selected pins and intervals between the selected pins in consideration of a pattern or size of a mask in a photolithography process. For example, the semiconductor design system 100 may adjust shapes of selected pins, intervals between the pins, intervals between pin groups, some combination thereof, or the like in an optimized form.

In step S140, the semiconductor design system 100 may determine whether the configuration of the pins selected and adjusted in the steps S120 and S130 violate one or more thresholds. Although pins may be selected based on a density of the selected pins being less than or equal to a density threshold, a threshold ("design rule") may be violated after adjusting one or more of shapes and locations of the pins. Moreover, the adjusted shapes of the pins may be also insufficient for a routing to be performed in the wiring layer 30. In some example embodiments, non-routable pins may exist even after adjusting one or more of a density, sizes, and shapes of pins. Accordingly, whether a routing rule is violated may be determined to prevent non-routable circumstances. Based on a determination that there are one or more selected pins violating a routing rule (S140=Yes), the selected pins may be referred to as finally selected pins, and the procedure goes to the step S120. Pins violating a routing rule may be additionally processed for density adjustment in the step S120 and for shape adjustment in the step S130. Contrarily, in the case that there is no pin violating the routing rule (S140=No), the procedure goes to step S150. An iterative loop composed of the steps S120, S130, and S140 will be hereafter referred to as a pre-processing loop which is performed before an automatic wiring design by the disposition and wiring tool 134 based on a library.

In step S145, a particular type of logic cell to be implemented ("established") in the semiconductor device may be selected. The logic cell may be selected from one of a plurality of potential types of logic cells.

In the step S150, a net list may be generated based on the finally selected pins and the selected logic cell. The inter-pin routing tool 132 may receive connection information associated with selected pins may automatically generate the net list based preliminarily input setup information, may generate the net list based on the selected logic cell, some combination thereof, or the like. For example, in the case of electrically connecting two different pins, in the case of electrically connecting three different pins, or in the case of electrically connecting many pins as like a power line, connection information may be provided through a net list. The net list may be generated based at least in part upon the selected logic cell and the selected pins, such that the net list defines electrical connections-between-some or all of the selected pins that implement the selected logic cell when the electrical connections are established. The connection information may include information indicating the selected logic cell and one or more parameters associated with electrical connections between pins that implement the selected logic cell.

In step S160, the inter-pin routing generation tool 132 may generate an interface script, which can be processed by the disposition and wiring tool 134 performing a wiring based on a library, based on the net list. For example, the inter-pin routing generating tool 132 may perform an interfacing operation for applying a pin-based routing to a library-based routing tool. That is, the inter-pin routing generation tool 132 may convert a pin-based net list into a library-based net list.

In step S170, the disposition and wiring tool 134 may process the converted interface script to automatically generate a routing between pins. In step S180, the one or more tools 195 may generate a wiring structure that establishes the electrical connections between one or more sets of pins in the finally selected pins as defined by the net list. Generating the wiring structure may include generating the routing, providing material in the routing to generate one or more vias, providing wiring material in the routing to generate one or more metal lines, providing material in the routing to generate some or all of the wiring structure, some combination thereof, or the like. The electrical connections may establish the selected logic cell in the semiconductor device.

The procedure for automatically generating a routing between pins is described as aforementioned according to some example embodiments of the inventive concepts. The pre-processing loop according to some example embodiments of the inventive concepts may automatically perform selection or adjustment of pins without a manual. Additionally, by making an interface script for selected pins, it may be permissible-to perform an automatic routing between pins through the library-based disposition and wiring tool 134.

Figure 5:
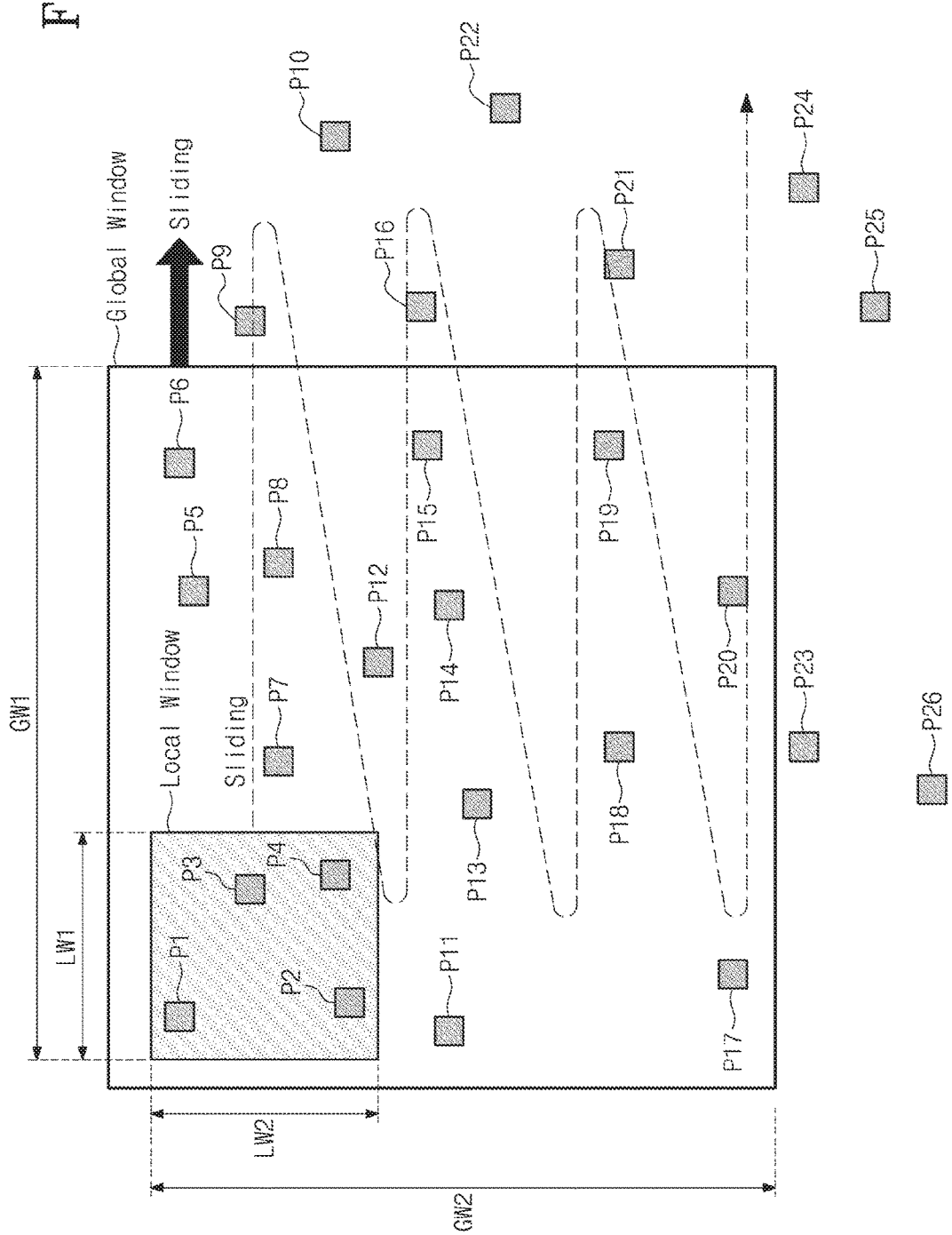
FIG. 5 illustrates a density adjusting method for pins as an example of a pre-processing loop.

FIG. 5 illustrates a density adjusting method for pins as an example of a pre-processing loop according to some example embodiments. Referring to FIG. 5, the density adjusting method for pins, also referred to herein as adjusting a density of pins on a given area of the semiconductor device, is illustrated in correspondence with one of the operations in the pre-processing loop. The density adjusting method may be performed with regard to one or more of candidate pins of the semiconductor device, selected pins of the semiconductor device, some combination thereof, or the like. In some example embodiments, positional information associated with pins is provided, and a density adjustment with regard to the pins is performed, based on the positional information, to restrict intervals between pins or the number of routable pins in a reference semiconductor area. In some example embodiments, a multiple window method using GW and LW may be employed to adjust a density of pins in a given semiconductor area.

If a semiconductor area and locations of pins are determined for testing, density of pins may be checked by the multiple window method. In some example embodiments, a dual density checking operation using LW and GW may be performed. However, window sizes may be variable in multiple modes in accordance with a direction of operation. First, an LW may be applicable to expose a selected semiconductor area. The LW may be provided, for example, to restrict the maximum number of routable pins between adjacent pins. By restricting density or congestion of pins within the semiconductor area exposed by the LW (referred to herein as a "local area"), routable pins which are relatively close to each other may be selected.

For example, if the number of pins which can be accommodated in an LW of the shown size LW1×LW2 is restricted to 3, one of candidate pins P1, P2, P3, and P4 present in the LW may be excluded from selection for routing. A non-selection condition in the LW may be added to an LW application condition. For example, one of the pins P3 and P4, which are disposed with the smallest intervals between them, among the candidate pins P1, P2, P3, and P4, may be excluded from selection. Additionally, the inter-pin routing generation tool 132 may be programmed to exclude the pin P4, which is disposed with a relatively irregular interval to each of the candidate pins P1 and P2, from among the pins P3 and P4. However, it can be understood that an LW selection condition for density adjustment may be variable in accordance with a direction of the adjustment. In some example embodiments, if density adjustment is performed through the LW in a specific coordinate, the LW may slide to the next coordinate to expose a next semiconductor area. Then, pins in the exposed next semiconductor area may be selected in accordance with the same density condition in the next coordinate. In some example embodiments, the LW may slide between successive coordinates in a zigzag pattern as shown in FIG. 5. In some example embodiments, the LW may slide in various patterns to improve efficiency of a process of performing density adjustment and/or selecting pins based on the LW.

After density adjustment is adjusted with an LW in a local area, a GW may be used to complete the density adjustment. Although density of a local area is adjusted through the LW, pins suitable for a local density condition (e.g., a set of pins in a given exposed local area that have a density that does not exceed a density threshold associated with the LW) may be crowded in a part of a routing area (e.g., a set of pins in a given area exposed by the GW may have a density that exceeds a density threshold associated with the GW). Although a routing condition may be locally satisfied, there may be a case that causes a routing to be difficult in view of a wider area. This problem may be solved through application of a GW thereto.

The umber of pins which can be accommodated in a GW may be provided with a specific value, referred to herein as a density threshold associated with the GW. In the case that the number of pins included in a given area exposed by the GW is over a reference (e.g., density threshold), one or more of the pins included in the given area may be removed. For example, pin pairs, which are disposed with a smaller interval, may be selected from pins and the one of the selected pin pairs may be unselected based on relative intervals to other pins. However, a pin selection condition within a GW may be variably applicable in accordance with intention of a user, a type of a tool, or a design rule of a semiconductor device.

Additionally, the LW size of LW1×LW2, the GW size of GW1×GW2, and the numbers of pins accommodated respectively in the windows may be variably applicable in accordance with a design rule, or a type of the disposition and wiring tool 134.

Figure 6B:
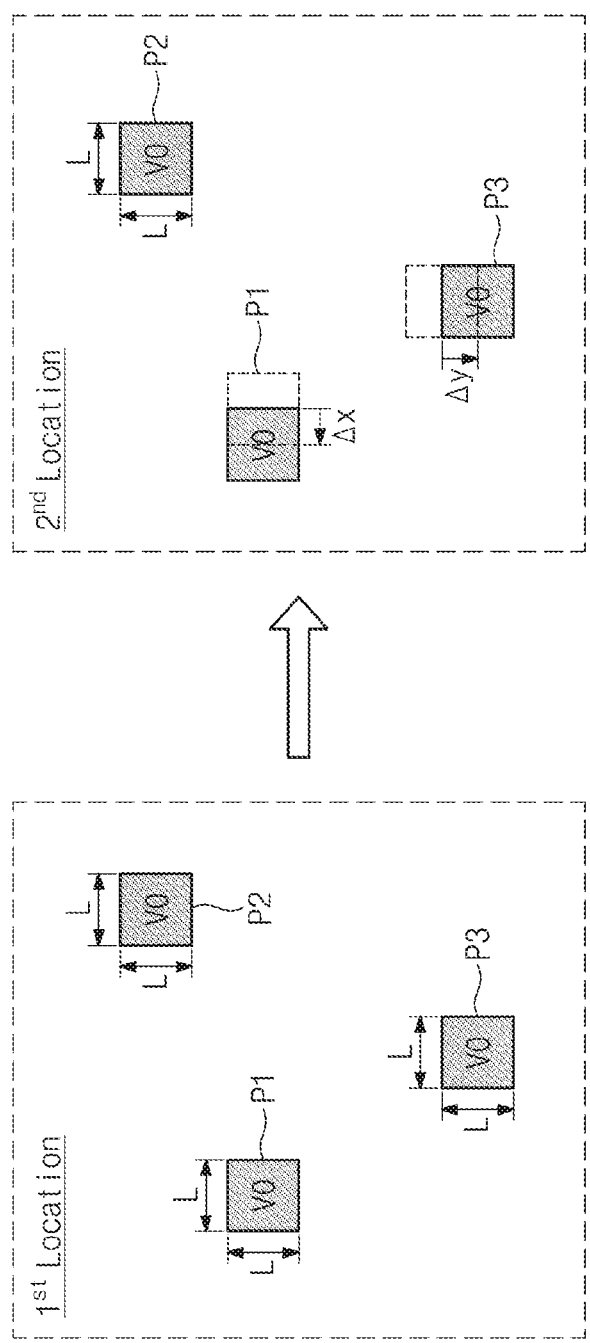
Figure 6C:
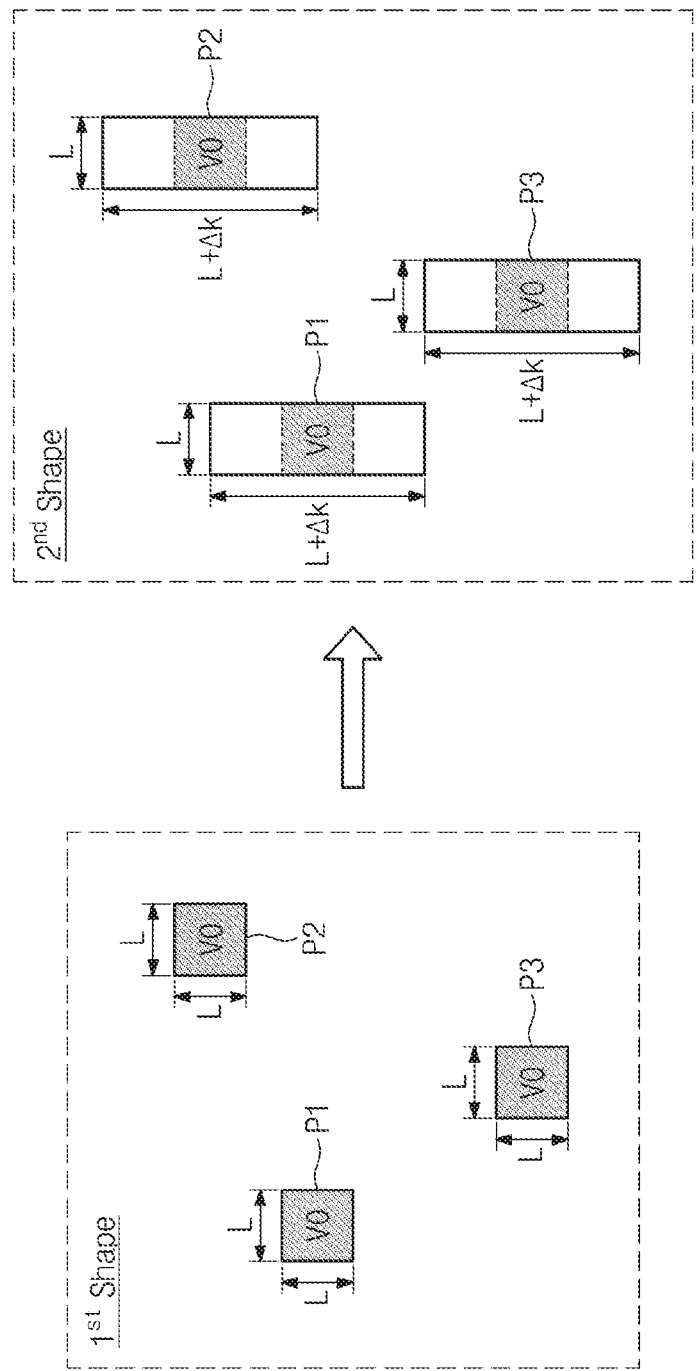

FIGS. 6A, 6B, and 6C schematically illustrate a method for adjusting sizes or shapes of pins during a pre-processing loop for routing. FIG. 6A schematically illustrates an example for adjusting sizes of pins, FIG. 6B schematically illustrates an example for adjusting locations of pins, and FIG. 6C schematically illustrates an example for adjusting shapes of pins. The size adjusting method may be performed with regard to one or more of candidate pins of the semiconductor device, selected pins of the semiconductor device, some combination thereof, or the like.

FIG. 6A illustrates a function of adjusting sizes of pins in the pre-processing loop by the inter-pin routing generation tool 132. If pins are selected from candidate pins which are included in a semiconductor area, sizes of the selected pins may be adjusted to increase and/or maximize the routing efficiency of a routing between some or all of the pins. For example, sizes of pins may be optimized to a design rule which restricts one or more of widths of wires and intervals between the wires. Based on adjusting sizes of the selected pins to reduce widths of the wires, intervals between wires, some combination hereof, etc. an efficiency of a routing between the pins may be improved. Pins P1, P2, and P3 selected by the adjustment may be provided with a first size ($1^{st}$ Size). However, the size of the pins P1, P2, and P3 may increase or decrease in consideration of the routing efficiency or design rule. For example, the pins P1, P2, and P3 with the first size ($1^{st}$ Size) may be adjusted with a second size ($2^{nd}$ Size).

The pins P1, P2, and P2 may be connected respectively to a wiring layer 30 through vias. The pins P1, P2, and P3 may be provided respectively with the primary size L×L. In some example embodiments, according to a design rule, vias VO corresponding to the pins may be formed with the second size ($2^{nd}$ Size). Accordingly, the inter-pin routing generation tool 132 may refer to a design rule to adjust sizes of general pins into another size of (L+ΔL)×(L+ΔL) in an area to which a routing is applied. Although this embodiment is described as increasing sizes of vias corresponding to pins in the case of an enlarged design rule, embodiments of the inventive concepts may not be restrictive hereto. For example, the pins P1, P2, and P3 may be respectively adjusted to have sizes of (L−ΔL)×(L−ΔL) in accordance with a design rule.

FIG. 6B illustrates a function of adjusting locations of pins in the pre-processing loop by the inter-pin routing generation tool 132. Even in pins which are adjusted with density, those pins may be adjusted in location, efficient for forming wires or vias, to substantially enhance the routing efficiency. In some example embodiments, if locations of the pins are adjusted in accordance with a design rule, a routing between the pins may be simplified in structure. Such a simplified structure may include reduced wire widths, reduced intervals between wiring, some combination thereof, or the like.

The pins P1, P2, and P3 selected by the density adjustment may be provided to a first location ($1^{st}$ Location). Locations of the pins P1, P2, and P3 may be some adjusted in consideration of the routing efficiency or design rule. For example, the pin P1 may correspond to a drain or source terminal of a transistor. In the case that a drain or source terminal is connected with a metal layer through a via, the pin P1 may be slightly shifted in a doped region. For example, the pin P1 may be shifted as much as an adjusting distance Δx from the original location indicated by a broken line. As also, the pin P3 for raising the routing efficiency may be shifted an adjusting distance Δy in the other direction.

FIG. 6C illustrates a function of adjusting shapes of pins in the pre-processing loop by the inter-pin routing generation tool 132. If shapes of the pins are determined, a part of the pins may be involved in a case that a wiring layer is connected with a metal through vias. Vias may be even directly formed on pins corresponding to terminals of a transistor. In this case, shapes of the pins may be considered in the form including overhangs of vias. Shapes of vias may be substantially adjusted along a direction of metal lines of a wiring layer.

The pins P1, P2, and P3 selected by the density adjustment may be provided with a first shape ($1^{st}$ Shape). However, shapes of the pins P1, P2, and P3 may be respectively variable in consideration of the case that these pins are connected to upper metal layers ("metal lines") with vias. For example, the pin P1 may be adjusted in a shape of a via having w lengthwise with L+Δk including an overhang. This adjustment to a via shape may contribute to electrical connections by one or more of the pins with metal lines which are provided to a wiring layer to establish the wiring structure. In some example embodiments, shapes of the pins P2 and P3 may be adjusted in the same manner.

Figure 7A:
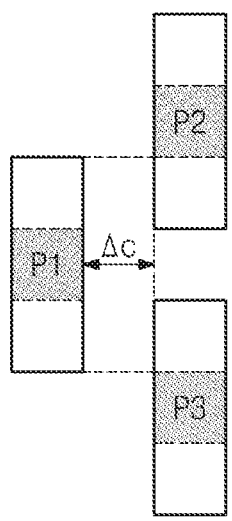
FIGS. 7A-B illustrate a function of checking color rule violation for pins as another example of a pre-processing loop.
Figure 7B:
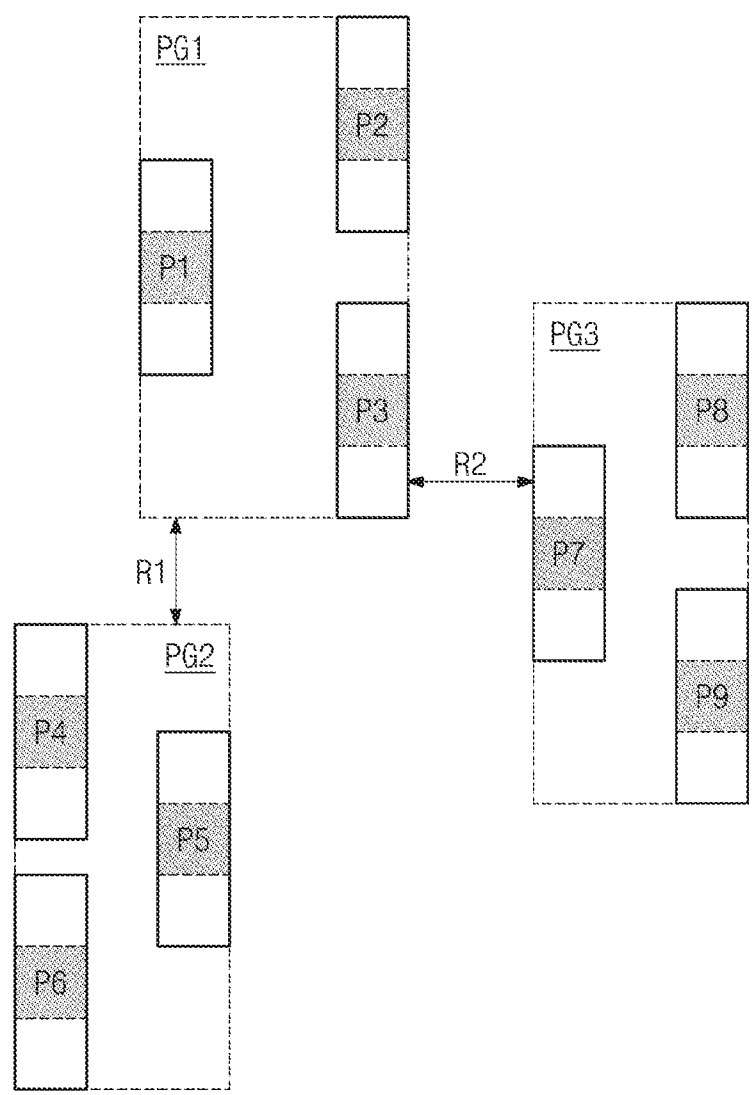

FIGS. 7A and 7B illustrate a function of checking color rule violation for pins as another example of a pre-processing loop. FIG. 7A illustrates a color rule checking function between pins and FIG. 7B illustrates a color rule checking function between pin groups. The color rule checking function ("method") may be performed with regard to one or more of candidate pins of the semiconductor device, selected pins of the semiconductor device, some combination thereof, or the like.

FIG. 7A shows a scheme for checking color rule violation between pins. Referring to FIG. 7A, a pattern of a mask which is applied to a photolithography process for forming respective pins may be monitored. In some example embodiments, at least two or more masks may be used to form respective pins in the semiconductor device in a photolithography process. A mask used to form the pin P1 may be different from a mask used to form the pin P2. In some example embodiments, pins formed using one or more masks may be formed in inadvertent shapes due to diffraction or scattering of light in accordance with patterns of masks during an exposure process. Accordingly, whether an interval standard AC between pins formed by different masks is satisfied (whether the interval exceeds a threshold associated with the interval) may be checked before generating a routing.

A rule for a pattern formed by different masks is called a color rule. A color rule may include a threshold associated with an interval between pins formed using different masks. The color rule may be violated by an interval between pins formed using different masks that exceeds the threshold. A color rule for pins formed by different masks may be applied at a step of selecting and adjusting pins.

FIG. 7B shows a color rule checking function for respective pins in the unit of pin group. Pin groups PG1, PG2, and PG3 without color rule violation according to some example embodiments are illustrated in FIG. 7B. For example, the interval between the pins in pin group PG1 may be equal to or less than a threshold associated with the interval. Although the color rule agrees between pins included in pin groups PG1, PG2, and PG3, a determination may be made regarding whether the color rule agrees in the unit of pin group (e.g., a determination regarding whether an interval between separate pin groups exceeds a threshold associated with the interval between pin groups).

For example, it may be permissible to check whether an interval R1 between the first pin group PG1 and the second pin group PG2 violates the color rule (e.g., interval R1 exceeds a threshold associated with the interval) or whether the color rule agrees between the first pin group PG1 and the second pin group PG2 (e.g., interval R1 is equal to or less than the threshold associated with the interval). In some example embodiments, it may be permissible to check whether an interval R1 between the first pin group PG1 and the third pin group PG3 violates the color rule or whether the color rule agrees between the first pin group PG1 and the third pin group PG3. If such a color rule checking function is executed before a routing for pins is generated, the reliability of the pins which are formed by a photolithography process may be improved.

FIG. 8 is a table showing a net list of pins according to some example embodiments of the inventive concepts. Referring to FIG. 8, it may be permissible to provide electrical connection relationships of pins which are finally selected through the pre-processing loop by the inter-pin routing generation tool 132. Information associated with the electrical connection relationships may be provided to enable the performing of a routing to connect a pin with another pin, to enable the performing of a routing to connect a pin with two different pins, to enable the performing of connecting a pin with a plurality of pins, some combination thereof, or the like. In some example embodiments of the inventive concepts, a net list defining electrical connection relationships between pins (e.g., a net list defining electrical connections between pins) will be simply described hereafter.

A 2-pin net (2-PIN) of pins to be electrically connected to each other may be provided at a first time. A 2-pin net Net_21 may have a start pin P1 and an end pin P2 for routing. As another example of the 2-pin net, Net_2i may have a start pin P21 and an end pin P22. The 2-pin net may be the most simply structured net in the net list for routing. Although the table simply shows the start pin P1 and the end pins P2, the table may further include various information such as geometrical information, positional information, and material information of pins substantially.

Examples of 3-pin nets may be shown with Net_31, Net_33, and Net_3j. The 3-pin net Net_31 may define connection relation between pins P31, P33, and P34. For example, according to the 3-pin net Net_31, the pin P31 may be connected with the pins P33 and P34. In some example embodiments, according to the 3-pin net Net_33, pins P35 and P37 may be connected with a pin P36. According to the 3-pin net Net_3j, a pin P41 may be connected with pins P42 and P44.

Additionally, examples of 4-pin nets may be shown with Net_41, Net_43, and Net_4. The 4-pin nets may define connection relation between four pins. In addition, various structured of pins may be provided in a net list. Such a net list may be defined for pins selected by the inter-pin routing generation tool 132. A net list may be also set by user's inputs or may be generated automatically from pins which are finally selected.

A net list may defines electrical connections between pins that, when established, result in the establishment of a particular logic cell in the semiconductor device. Based on the selection of a particular logic cell, a net list may be generated that defines one or more electrical connections between some or all of the selected pins that, when generated, establishes (implements) the selected particular logic cell in the semiconductor device based on establishing the one or more electrical connections in the semiconductor device.

Figure 9:
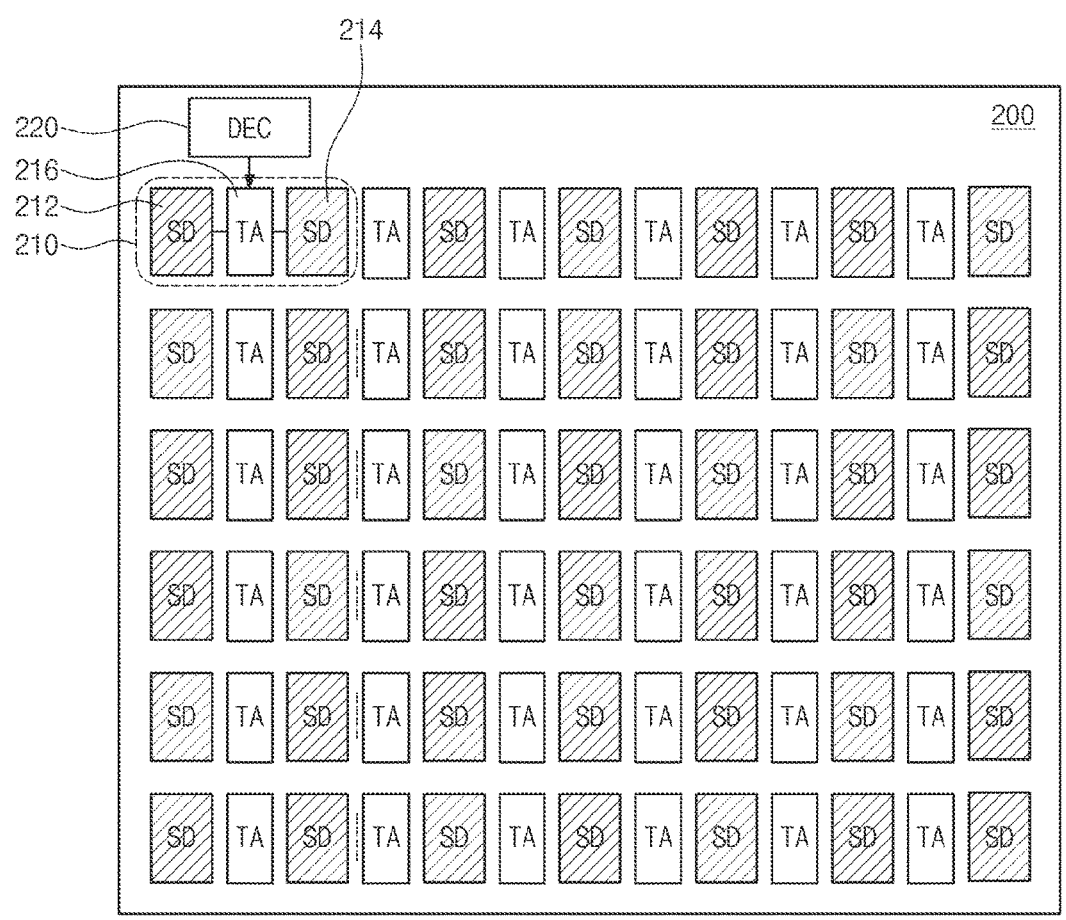
FIG. 9 illustrates a testing semiconductor device which is fabricated by an automatic routing generation method according to some example embodiments of the inventive concepts.

FIG. 9 illustrates a testing semiconductor device which is fabricated by an automatic routing generation method according to some example embodiments of the inventive concepts. Referring to FIG. 9, a testing semiconductor device 200 may include a test target are 210 and a decoder 220.

The test target area 210 may include source/drain pads 212 and 214, and a test area 216. The test area 216 may be a semiconductor area in which a plurality of pins is arranged. If pins are generated for the test area 216, a routing according to some example embodiments of the inventive concepts may be performed automatically. Test target transistors may be selected by selecting pins which are connected to the decoder 220 and by selecting pins which are connected to the source/drain pads 212 and 214. According to an inter-pin routing method according to some example embodiments of the inventive concepts, it may be allowable to select pins as many as possible in the test area 216, and to automatically generate a routing for selected pins through the commercial disposition and wiring tool 134 (see FIG. 3).

As described above, in routing pins before generating a library, the library-based disposition and wiring tool 134 may be used for a design with automatic generation of a routing. A semiconductor design system according to some example embodiments of the inventive concepts may automatically perform a routing between pins of transistors before defining a library. Accordingly, comparative to the prior manner dependent on a manual, it may be allowable to enhance a routing generation speed and to remarkably increase the number of device elements to be tested.

According to a routing method according to some example embodiments of the inventive concepts, it may be allowable to automatically generate a wiring between pins through a commercial routing tool by using only geometrical information such as pin locations, sizes, and shapes before generation of a library. Additionally, by preliminarily adjusting optimum density, locations, and shapes of pins before routing, it may be accomplishable to remarkably increase the number of selectable devices for test.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method for designing and fabricating a routing between pins of a semiconductor device, the method comprising:
    selecting one or more pins of a plurality of candidate pins corresponding to terminals of transistors in the semiconductor device as selected pins based on at least one of density, shapes, intervals, and sizes associated with the plurality of candidate pins;
    adjusting at least one of the density, shapes, intervals, and sizes associated with one or more pins of the selected one or more pins;
    generating a net list associated with the selected one or more pins, the net list defining a set of electrical connections between the selected one or more pins; and
    driving a disposition and wiring tool to generate and fabricate a wiring structure that includes the electrical connections between the selected one or more pins, based on the net list.

2. The method of claim 1, wherein the adjusting includes,
    adjusting a density of one or more of the candidate pins based on removing one or more of the candidate pins, based on a determination that a density of the candidate pins exceeds a density threshold, such that one or more of the selected pins are selected based on adjusting the density of the candidate pins; and
    adjusting a shape of the selected one or more pins such that a routing efficiency associated with a routing generated between the selected one or more pins is increased.

3. The method of claim 2, wherein the adjusting the density of the one or more candidate pins includes,
    sliding a local window over the semiconductor device to determine whether a density of candidate pins in a local area of the semiconductor device exposed by the local window exceeds a first density threshold, and
    sliding a global window over the semiconductor device to determine whether a density of candidate pins in an area of the semiconductor device that is larger than the local area exceeds a second density threshold.

4. The method of claim 2, wherein the adjusting the shape of the selected one or more pins includes
    adjusting a size of the selected one or more pins,
    adjusting a shape of one or more vias corresponding to the selected one or more pins, or
    adjusting a direction of the one or more vias.

5. The method of claim 2, wherein the adjusting the shapes of the one or more selected pins includes checking a color rule of a mask for forming the one or more selected pins.

6. The method of claim 5, wherein the adjusting the shape of the selected one or more pins includes
    based on a result of the color rule that an interval between separate sets of selected pins formed according to different masks is less than a threshold associated with the interval, adjusting at least one of,
    a shape of one or more pins,
    a location of one or more selected pins in the semiconductor device, and
    a size of one or more selected pins.

7. The method of claim 1, wherein the driving includes generating an interface script to execute the net list in the disposition and wiring tool that is driven in a computer system.

8. The method of claim 7, wherein the interface script is converted from a pin-based netlist to a library-based netlist.

9. A method for fabricating a testing semiconductor device using a semiconductor design system driving a library-based routing tool, the method comprising:
    generating pins corresponding to terminal locations of device elements to be tested;
    selecting pins from the generated pins in accordance with routable density;
    adjusting one of location, shape, size, and interval of at least one pin of the selected pins;
    generating a net list from information associated with a connection relation of the adjusted at least one pin;
    generating an interface script, which is drivable through a library-based routing tool, from the information associated with the connection relation that is provided to the net list;
    executing the interface script through the library-based routing tool; and
    forming a wiring structure between the selected pins using a result of the executing the interface script,
    wherein the net list defines electrical connections between the adjusted at least one pin corresponding to terminals of transistors.

10. The method of claim 9, wherein the pins are generated before generating a cell library that is utilized in the library-based routing tool.

11. The method of claim 9, wherein at least one pin of the adjusted at least one pin corresponds to a probing pad that is formed to measure electrical characteristics of device elements to be tested.

12. The method of claim 9, further comprising:
    checking density of the adjusted at least one pin after the adjusting.

13. The method of claim 12, wherein the selecting of the pins includes removing at least one pin that violates a density reference.

14. The method of claim 9, wherein the adjusting includes checking a color rule of a mask for forming the selected pins.

15. The method of claim 14, wherein the adjusting includes adjusting at least one of shapes, locations, and sizes of pins in consideration of the color rule of the mask.

16. A computer-based design system driving a disposition and wiring tool for performing a design and fabrication of a semiconductor device, the system comprising:
- a communication interface configured to receive geometrical or positional information of candidate pins corresponding to terminal locations of transistors to be formed on the semiconductor device;
- a working memory configured to load an inter-pin routing generation tool for selecting pins from the candidate pins in accordance with routable density, for adjusting one of location, shape, size, and interval of at least one pin of the selected pins, for making a net list from information associated with the adjusted at least one pin, and for generating an interface script to execute the net list through the disposition and wiring tool; and
- a central processing unit configured to execute the inter-pin routing generation tool and the disposition and wiring tool with reference to information that is provided from the communication interface.

17. The system of claim 16, wherein the central processing unit is configured to execute the inter-pin routing generation tool to
- select pins from the candidate pins in accordance with routable density,
- adjust one of location, shape, size, and interval of at least one of the selected pins,
- generate the net list from information associated with connection relation of the adjusted at least one pin, and
- generate an interface script from the net list to execute a library-based disposition and wiring tool.

18. The system of claim 17, the central processing unit execute the inter-pin routing generation tool to check a color rule of a mask for forming the at least one of the selected pins.

19. The system of claim 17, wherein the central processing unit is configured to execute the inter-pin routing generation tool to
- adjust a shape of one or more vias corresponding to at least one of selected pins, or
- adjust a direction of the one or more vias.

20. The system of claim 17, wherein the central processing unit is configured to execute the disposition and wiring tool to execute the interface script through the library-based disposition and wiring tool to fabricate one or more physical routings between the selected pins.

* * * * *